(12) United States Patent
Akamatsu

(10) Patent No.: US 7,209,215 B2
(45) Date of Patent: Apr. 24, 2007

(54) EXPOSURE APPARATUS AND METHOD

(75) Inventor: Akio Akamatsu, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/459,674

(22) Filed: Jul. 25, 2006

(65) Prior Publication Data

US 2007/0019176 A1   Jan. 25, 2007

(30) Foreign Application Priority Data

Jul. 25, 2005   (JP)   ............................ 2005-214462

(51) Int. Cl.
*G03B 27/52* (2006.01)
*G03B 27/54* (2006.01)

(52) U.S. Cl. .......................... 355/55; 355/67
(58) Field of Classification Search .................. 355/52, 355/53, 55, 67; 356/399–401; 250/548
See application file for complete search history.

(56) References Cited

U.S. PATENT DOCUMENTS

| | | | | |
|---|---|---|---|---|
| 6,674,510 B1 * | 1/2004 | Jasper et al. | ................... | 355/55 |
| 6,906,785 B2 * | 6/2005 | Queens et al. | ................. | 355/53 |
| 7,050,151 B2 * | 5/2006 | Miura | ......................... | 355/53 |
| 2004/0179180 A1 | 9/2004 | Miura | | |
| 2005/0128453 A1 | 6/2005 | Miura | | |
| 2005/0161615 A1 | 7/2005 | Maeda et al. | | |

FOREIGN PATENT DOCUMENTS

| | | |
|---|---|---|
| JP | 6-236837 | 8/1994 |
| JP | 11-016827 | 1/1999 |
| JP | 3304535 | 5/2002 |

\* cited by examiner

*Primary Examiner*—Henry Hung Nguyen
(74) *Attorney, Agent, or Firm*—Morgan & Finnegan LLP

(57) ABSTRACT

An exposure apparatus for exposing a pattern of a reticle onto a plate while synchronously scanning the reticle and the plate, said exposure apparatus includes a projection optical system for projecting the pattern of the reticle onto the plate, a measuring part for measuring a position of a surface of a target to be measured in an optical axis direction of the projection optical system, and a controller for controlling the position of the surface of the target in the optical axis direction based on a measurement result by the measuring part, wherein said measuring part measures a position of the same measurement point on the surface of the target plural times, wherein said controller uses, as a measurement value of the same measurement point, an average value of plural measurement results obtained at the same measurement point, and wherein said target is the reticle or the plate.

7 Claims, 18 Drawing Sheets

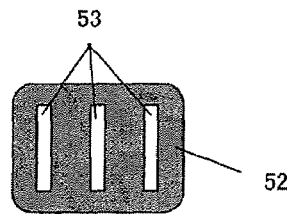
FIG. 3
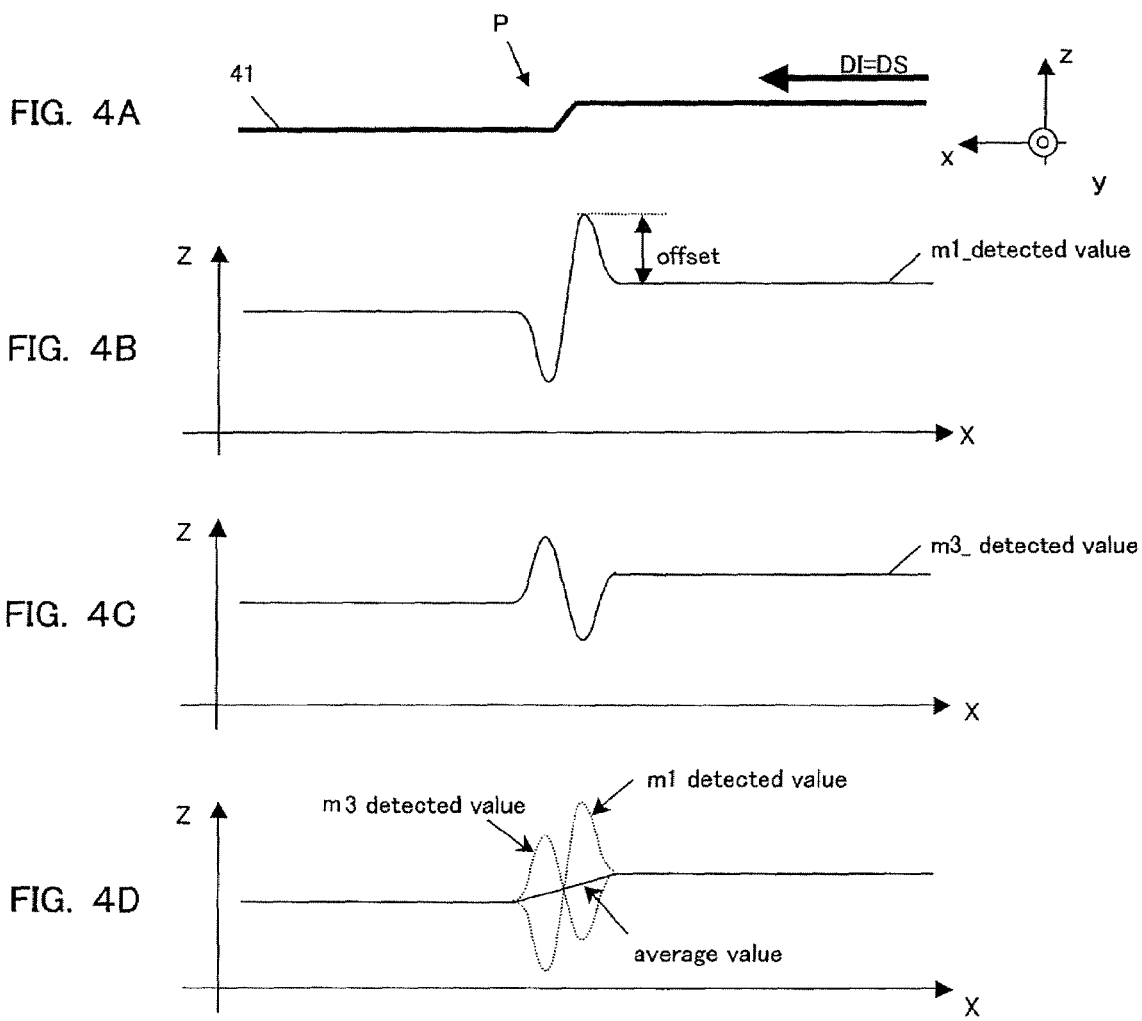
FIG. 4A
FIG. 4B
FIG. 4C
FIG. 4D

EXPOSURE APPARATUS AND METHOD

BACKGROUND OF THE INVENTION

The present invention relates generally to an exposure apparatus, and more particularly to an exposure apparatus and method that scan-exposes a reticle pattern onto the plate. The present invention is suitable, for example, for an exposure apparatus and method that include a measuring system for measuring a position of a wafer surface. In the present invention, an object measured and focus-controlled (in other words, a target to be measured or a target to be controlled) is not limited to a plate to be exposed, such as a single crystal substrate of a semiconductor wafer and a glass plate for a liquid crystal display ("LCD"), and includes a reticle (mask) that has a circuit pattern.

A projection exposure apparatus has been conventionally been used to transfer a reticle pattern on a reticle onto a wafer via a projection optical system, and an exposure apparatus that accurately and economically exposes a wide screen at a high resolution has been increasingly demanded. A shorter wavelength of an exposure light and a higher numerical aperture ("NA") of the projection optical system are effective to improve the resolution. A conventional stepper has been replaced mainly with a step-and-scan exposure apparatus (also referred to as a "scanner") that relatively scans the reticle and the wafer through an exposure area of slit form to expand the exposure area.

Moreover, the scanner executes a focus leveling control (hereinafter, referred to as a "focus control" in this application) that sequentially accords the wafer surface with an optimal image plane for high quality exposure. The focus control obtains a position measurement result of a measurement point on the wafer surface before exposure, obtains position and tilt information based on the measurement result by a controller, and correctly drives a wafer stage that supports the wafer. The measurement information is obtained using a focus tilt measuring system that includes plural oblique incidence measuring systems. The measuring part includes a single type that pre-detects information of next exposure position while exposing and executes exposure and measurement in the same station, and a twin type that has a measurement station separated from an exposure station. The controller maintains, as a measurement offset, a difference between a measurement value of each point and the optimal image plane. See, for example, Japanese Patent Application, Publication No. 11-16827.

The shorter wavelength of the exposure light and the higher NA of the projection optical system decrease a focal depth and require strict accuracy (focus tilt accuracy) to accords the wafer surface with the optimal image plane. In addition, the number of measurement points has been decreased and a measurement offset accuracy has been deteriorated to improve the economy (throughput). Therefore, it is increasingly demanded to improve the measurement offset accuracy by few measurement points.

If a level difference by a transferred pattern etc. exists on the wafer surface, the measurement offset by a diffusion of a grazing incidence measurement light occurs according to a defocus amount in an optical axis direction. For example, if a level difference P extended in a perpendicular direction (Y direction) to an incident direction DI (X direction) of light from the measuring system exists on the wafer surface as shown in FIG. 4A, a signal that shows actual height after once greatly swinging is obtained from the level difference P as shown in FIG. 4B. This swing causes error measurement. Here, FIG. 4A is a schematic sectional view of a wafer surface 41 that has the level difference P. FIG. 4B is a waveform view of a position detected signal of the wafer surface 41.

BRIEF SUMMARY OF THE INVENTION

Accordingly, the present invention is directed to an exposure apparatus and method that achieve high quality exposure by high focus accuracy.

An exposure apparatus of one aspect of the present invention for exposing a pattern of a reticle onto a plate while synchronously scanning the reticle and the plate, said exposure apparatus includes a projection optical system for projecting the pattern of the reticle onto the plate, a measuring part for measuring a position of a surface of a target to be measured in an optical axis direction of the projection optical system, and a controller for controlling the position of the surface of the target in the optical axis direction based on a measurement result by the measuring part, wherein said measuring part measures a position of the same measurement point on the surface of the target plural times, wherein said controller uses, as a measurement value of the same measurement point, an average value of plural measurement results obtained at the same measurement point, and wherein said target is the reticle or the plate.

A device fabrication method according to another aspect of the present invention includes the steps of exposing a plate using the above exposure apparatus, and performing a development process for the plate exposed. Claims for a device fabricaton method for performing operations similar to that of the above exposure apparatus cover devices as intermediate and final products. Such devices include semiconductor chips like an LSI and VLSI, CCDs, LCDs, magnetic sensors such as, thin film magnetic heads, or the like.

An exposure method according to still another aspect of the present invention for exposing a pattern of a reticle onto a plate, via a projection optical system, while synchronously scanning the reticle and the plate, said exposure method includes steps of calculating a position of a measurement point on a surface of a target to be measured in an optical axis direction of the projection optical system by measuring plural times and averaging plural measurement results, and controlling a position of the surface of the target based on the position of the target calculated by the calculating step, wherein said target is the reticle or the plate.

Other objects and further features of the present invention will become readily apparent from the following description of the preferred embodiments with reference to the accompanying drawings.

BRIEF DESCRIPTION OF THE DRAWINGS

FIG. 3 is a schematic plane view of a slit board of the oblique incidence measuring system shown in FIG. 2A.

FIG. 4A is a schematic sectional view of the exposure apparatus shown in FIG. 1 when a level difference exists on the wafer surface, FIG. 4B is a measurement waveform that corresponds to a mark m1 on the level difference shown in FIG. 4A, FIG. 4C is a measurement waveform that corresponds to a mark m3 on the level difference shown in FIG. 4A, and FIG. 4D is a waveform view overlapped the waveforms shown in FIGS. 4B and 4C.

DETAILED DESCRIPTION OF THE PREFERRED EMBODIMENTS

Figure 1:
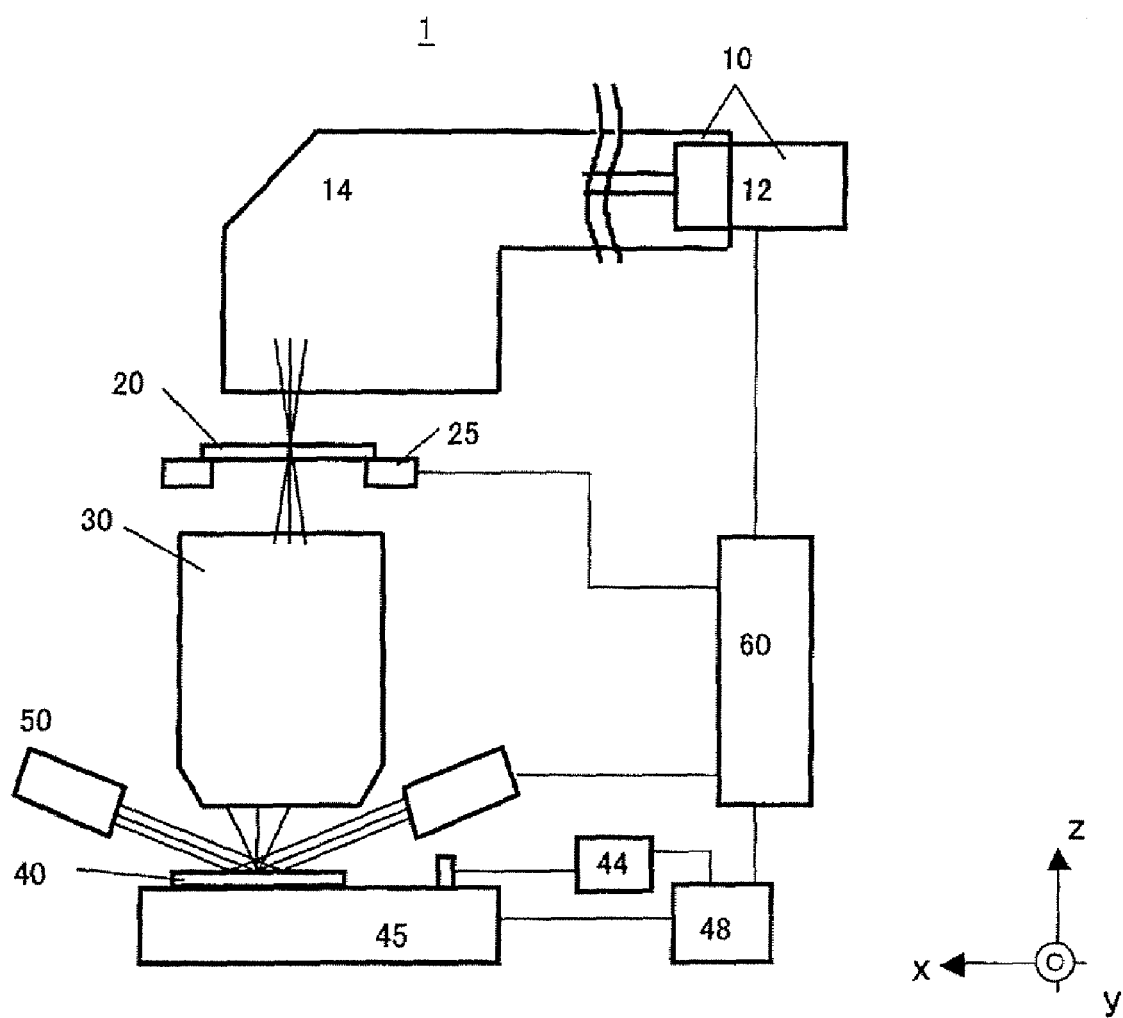
FIG. 1 is a schematic block diagram of an exposure apparatus of one aspect according to the present invention.

With reference to the accompanying drawings, a description will be given of an exposure apparatus 1 of one aspect according to the present invention. The exposure apparatus 1 is a scanner that exposes a circuit pattern of a reticle 20 onto a wafer 40. The exposure apparatus 1 includes, as shown in FIG. 1, an illumination apparatus 10, a reticle stage 25 that mounts the reticle 20, a projection optical system 30, a wafer stage 45 that mounts the wafer 40, a focus tilt measuring system 50, and a controller 60.

The illumination apparatus 10 illuminates the reticle 20 on which the circuit pattern to be transferred is formed, and includes a light source part 12 and an illumination optical system 14.

The light source part 12 uses, for example, a laser. The laser may use ArF excimer laser with a wavelength of approximately 193 nm and KrF excimer laser with a wavelength of approximately 248 nm etc. However, the kind of light source part is not limited to excimer laser.

The illumination optical system 14 is an optical system that illuminates a target surface to be illuminated using light from the light source part 12. The illumination optical system 14 forms light to an exposure slit with a form suitable for exposure and illuminates the reticle 20. The illumination optical system 14 includes a lens, a mirror, an optical integrator, a stop, and the like, for example, a condenser lens, an optical integrator (a fly-eye lens), an aperture stop, a condenser lens, a slit, and an image-forming optical system in this order. The illumination optical system 14 can use any light regardless of whether it is axial or non-axial light. The optical integrator may include a fly-eye lens or an integrator formed by stacking two sets of cylindrical lens array plates (or lenticular lenses), and can be replaced with an optical rod or a diffractive element.

The reticle 20 is made, for example, of quartz, forms the circuit pattern to be transferred. The reticle 20 is supported and driven by the reticle stage 25. Diffracted light from the pattern of the reticle 20 passes through the projection optical system 30 and is then projected onto the wafer 40. The reticle 20 and the wafer 40 are located in an optically conjugate relationship. The reticle 20 and the wafer 40 are scanned at the speed ratio of the reduction ratio of the projection optical system 30, thus transferring the pattern from the reticle 20 to the wafer 40.

The reticle stage 25 supports the reticle via a reticle chuck (not shown), and is connected to a moving mechanism (not shown). The moving mechanism includes a linear motor, etc., and moves the reticle 20 by driving the reticle stage 25 in X axis direction, Y axis direction, Z axis direction and rotation direction of each axis.

The projection optical system 30 images the diffracted light passing through the pattern of the reticle 20 onto the wafer 40. The projection optical system may use a dioptric system that includes only plural lens elements and a catadioptric system that includes plural lens elements and at least one concave mirror, etc. Any necessary correction of the chromatic aberration is available through a plurality of lens units made from glass materials having different dispersion values (Abbe values), or arrange a diffractive optical element such that it disperses in a direction opposite to that of the lens unit.

The wafer 40 is a plate to be exposed. Photoresist is applied to the wafer 40. The wafer 40 is replaced by a glass plate for the liquid crystal substrate and other plates in another embodiment. A position of the wafer surface is measured by the focus tilt measuring system 50.

The wafer stage 45 supports the wafer 40 via a wafer chuck (not shown) and is driven by a driving mechanism 48. The wafer stage 42 is similar to the reticle stage 25 and moves the wafer 40 in X axis direction, Y axis direction, Z axis direction and rotation direction of each axis using a linear motor. A position of the reticle stage 25 and a position of the wafer stage 45 are monitored, for example, by a laser interferometer and the like, so that both are driven at a constant speed ratio. The wafer stage 45 is installed on a stage stool supported on the floor and the like, for example, via a dampener. The reticle stage 25 and the projection optical system 30 are installed on a lens barrel stool (not shown) support, for example, via a dampener, to the base frame placed on the floor.

Figure 2A:
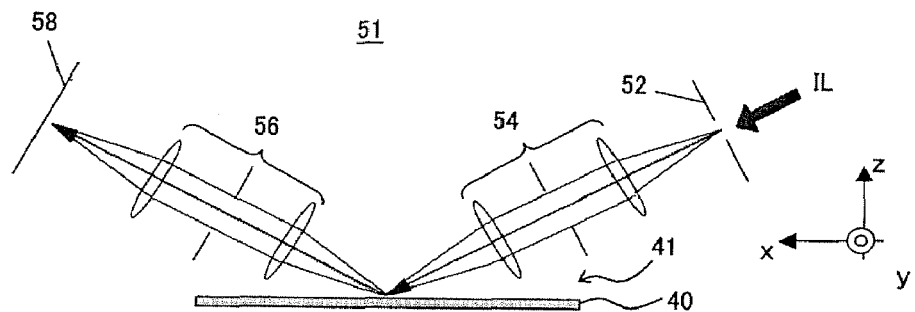
FIG. 2A is a schematic sectional view of a oblique incidence measuring system of a focus tilt measuring system shown in FIG. 1.

The focus tilt measuring system 50 includes plural oblique incidence measuring systems 51 shown in FIG. 2A, and measures a position of the wafer surface in Z direction during exposure. The focus tilt measuring system 50 is a twin type measuring part. Since the scan exposure reciprocates the exposure slit on the wafer surface, the scanning direction is two directions.

The scanner that includes the twin type measuring part measures, in exposure, the position of a certain exposure area in the optical axis direction before the exposure slit moves to next exposure area (the certain exposure area) and correctingly accords the wafer surface of the certain exposure area with an optimal image plane when exposing the certain exposure area. Therefore, the measurement point is arranged at front and back stages to the exposure slit because the scanning direction is two directions and it is necessary to measure the position of the wafer surface before exposure.

Figure 21:
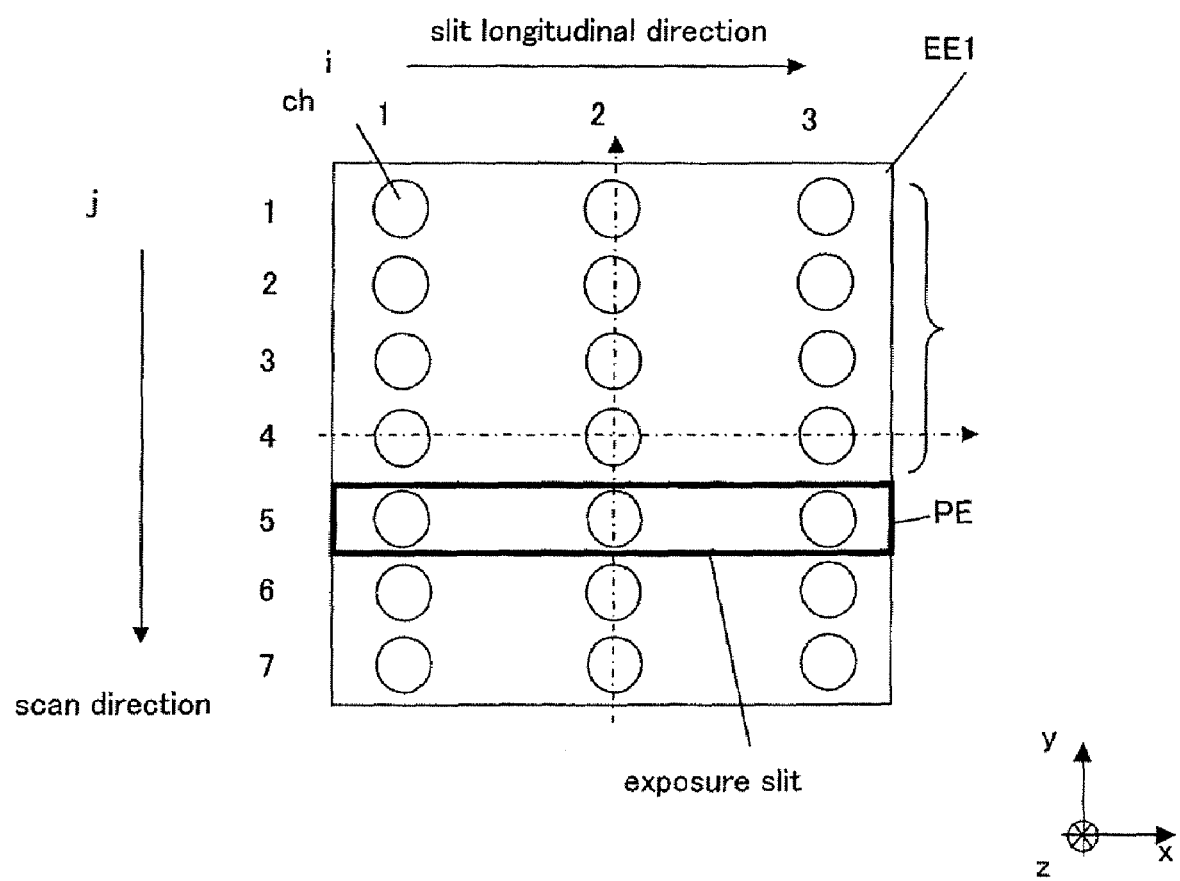
FIG. 21 is a schematic plane view of a relationship between an exposure slit and an arrangement of a measurement point in an exposure area of one shot.

For example, measurement points ch include seven points in a scanning direction SD of an exposure slit PE and three points in a longitudinal direction SL of the exposure slit PE orthogonal to the scanning direction in an exposure area EE1 of one shot as shown in FIG. 21. The measurement points ch of three points in the slit longitudinal direction SL by arranging three grazing measuring systems 51 and the measurement points ch of seven points in the scanning direction DS by scanning the wafer stage 45 in the scanning direction DS.

In the focus control, for example, while the exposure slit PE exposes a position of j=5 in the scanning direction DS, the position (focus) of the wafer surface 41 is measured using the measurement points ch of three points of j=6.

The oblique incidence measuring system 51 obliquely projects one pattern or plural patterns (referred to as a "mark") onto each measurement point and detects a reflected light from the measurement point using a detecting part. The position information of each measurement point (in other words, a height of the projection optical system in the optical axis direction) is obtained using a character that changes the position of the detecting part in the scanning direction according the change of the wafer surface. The grazing incidence measuring part 51 includes, as shown in FIG. 2A, a slit board 52, a projection optical system 54, a receiving optical system 56, and an image pick-up device 58. Here, FIG. 2A is a schematic sectional view of the oblique incidence measuring system 51. The position and tilt can be calculated at plural measurement points on the wafer surface 41 by arranging plural oblique incidence measuring system 51.

The slit board 52 has, as shown in FIG. 3, three slit patterns or marks 53 arranged at equal interval. The number of marks is not limited to three, may be five, seven or nine, may be an even number and may be one described later. A mark form is not limited to a line form and may be a circular form or other forms. Here, FIG. 3 is a schematic plane view of the slit board 52. The projection optical system 54 projects an image of the mark 53 onto the wafer surface 41. The receiving optical system 56 introduces the reflected light from the wafer surface 41 to the image pick-up device 58 such as a CCD and projects the image of the mark 53 onto a receiving surface of the image pick-up device 58.

In operation of the oblique incidence measuring system 51, an illumination light IL from a light source (not shown) is irradiated to the slit board 52 and an image (m1, m2, m3) of the mark 53 is projected onto the wafer surface 41 at low incident angle by the projection optical system 54. The mark image mh (h=1, 2, 3) is reflected by the wafer surface 41 and is re-imaged on the image pick-up device 58 by the receiving optical system 56. The light source is a light source that emits a non-exposure light, such as a LED and a halogen lamp.

Figure 2B:
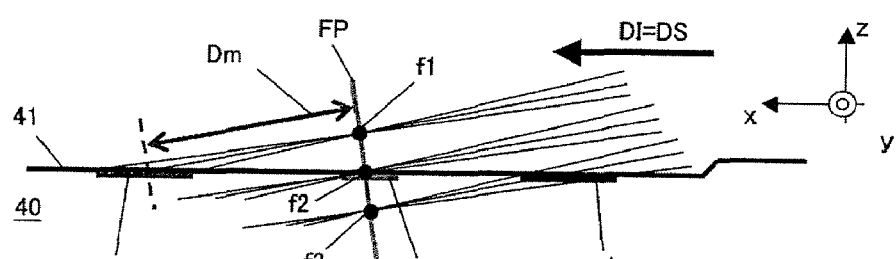
FIG. 2B is an enlarged view of a grazing incidence light shown in FIG. 2A near a wafer surface.
Figure 2C:
FIG. 2C is a schematic plane view of a mark image shown in FIG. 2B that is projected onto the wafer surface.

The wafer surface 41 does not accord with an image surface FP of the projection optical system 54 as shown in FIG. 2B. Here, FIG. 2B is a schematic sectional view of the mark image mh projected onto the wafer surface 41 by the projection optical system 54. As a result, although only imaging point f2 of the mark image m2 among plural mark images mh accords with a focal point that the wafer surface 41 and image surface FP intersect, other imaging points f1 and f3 of the marks m1 and m3 defocus from the wafer surface by a distance Dm. Therefore, in the mark images m1 and m3, the defocus amount is symmetry to the image surface FP as a center. As a result, the mark images m1 to m3 with different sizes each other are projected onto the wafer surface 41. Here, FIG. 2C is a schematic plane view of the mark image on the wafer surface 41.

If the number of the mark 53 is the even number, the image surface of center of four marks may accord with the wafer surface 41 and the image surface of other position may accord with the wafer surface 41 described later with FIG. 10B. If the number of the mark 53 is the other number, similarly the position of the image surface that accords with the wafer surface 41 is not limited.

Figure 2D:
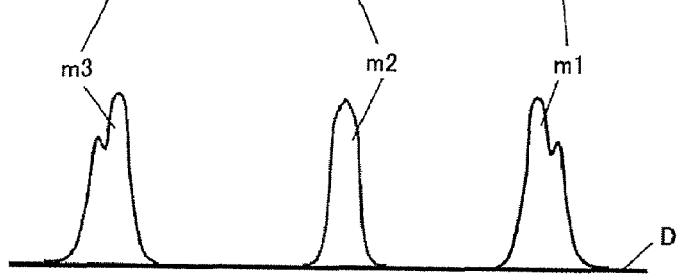
FIG. 2D is a measurement waveform that corresponds to a mark image when a level difference exists on the wafer surface.
Figure 5:
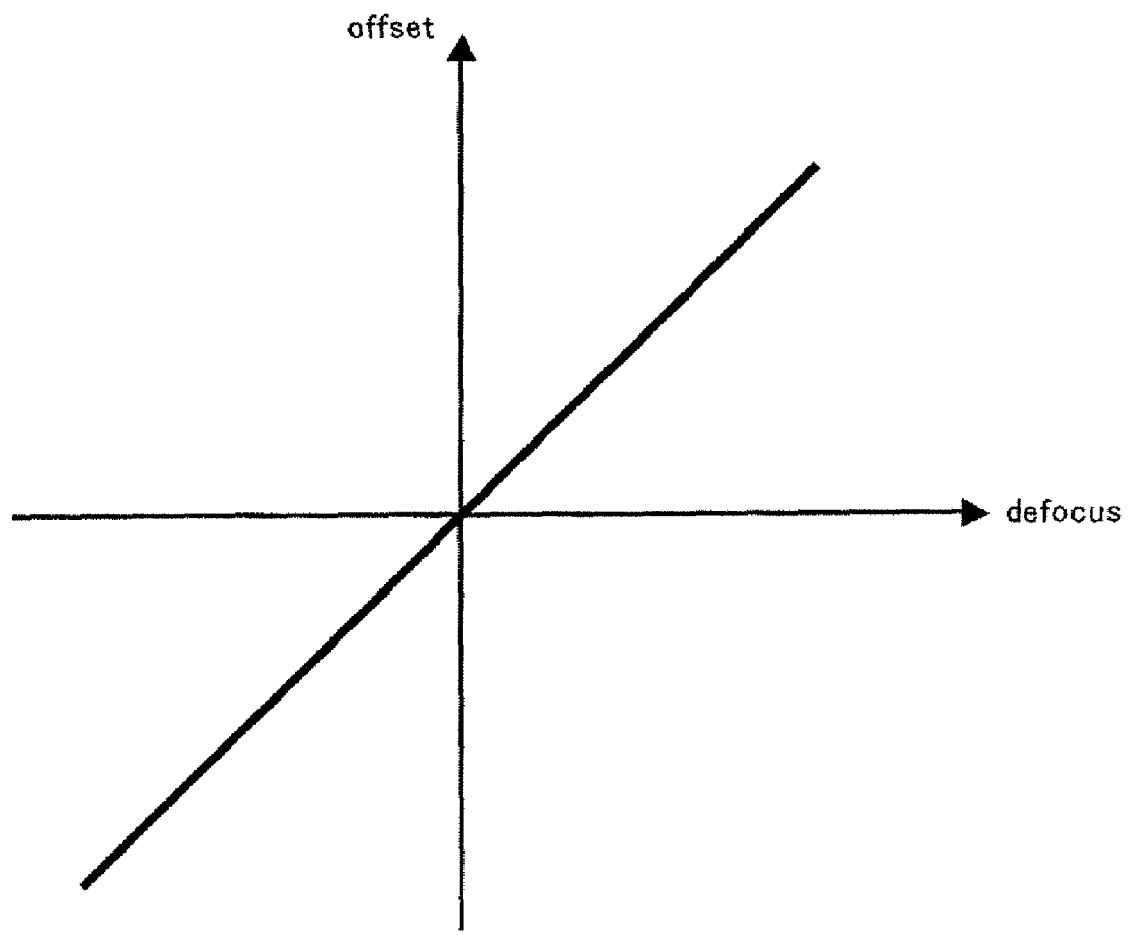
FIG. 5 is a graph of a relationship between a defocus amount and a measurement offset shown in FIG. 4B.

If the level difference P exists on the wafer surface 41, a distortion occurs in the mark image mh on the image pick-up device 58 as shown in FIG. 2D and a measurement offset (error measurement) occurs as shown in FIG. 4B. This error measurement amount is proportional to the defocus amount on the wafer surface 41 of the mark image mh as shown in FIG. 5. Here, FIG. 2D is a waveform view of an output signal to each mark image from the image pick-up device 58 when the level difference P exists on a position that corresponds to the mark image on the wafer surface 41. FIG. 5 is a graph of a relationship between the defocus amount and the measurement offset.

An inclination of a straight line shown in FIG. 5 depends on the height and direction of the level difference P and process processing etc. The error measurement occurs in cases where the level difference P exists on a position that corresponds to the mark image m1 and a position that corresponds to the mark image m3. In the defocus amount of both marks, positive-negative is reverse and an absolute value is the same. Therefore, in the offset amount, positive-negative is reverse and an absolute value is the same. Thereby, in the error measurement amount, positive-negative is reverse and an absolute value is the same. Moreover, in the mark image m2, the defocus amount is 0 and the measurement offset is also 0.

The error measurement amount can be offset by using this character. In other words, the surface position detected value that corresponds to the mark m1 becomes the detected value shown in FIG. 4B and the surface position detected value that corresponds to the mark m3 becomes the detected value shown in FIG. 4C. Since the defocus amount of the marks m1 and m3 is the same amount and opposite sign, the error measurement amount becomes also the same amount and opposite sign from the character shown in FIG. 5. Thereby, the surface position of the level difference P can be correctly detected by generalizing an average value of two detected results and canceling the error measurement shown in FIG. 4D.

The controller 60 includes a CPU and a memory (not shown), is electrically connected to the illumination apparatus 10, the reticle stage 25, the wafer stage 45 and the focus tilt measuring system 50, and controls operation of the exposure apparatus 1. The controller 60 obtains the output signal (in other words, measurement result) from the image pick-up device 58, performs an operation processing shown in FIG. 4D, and calculates the position and tilt of the wafer surface 41. For example, in FIG. 21, the controller 60 calculates the position and tilt in the slit longitudinal direction of the wafer surface 41 in j=5 based on the position information of the measurement point ch in j=5. Then, the controller 60 exposes the position of j=6 during correcting the focus and tilt by controlling the drive of the wafer stage 41 after exposure in j=5 is completed. If the wafer surface 41 changes in Z direction, the mark image mh change in X direction of the image pick-up device 58. The controller 60 calculates the position of the wafer surface 41 for each measurement point by calculating the position of the mark image. The controller 60 executes the focus leveling control based on the calculated result.

In operation of the exposure apparatus 1, light from the illumination apparatus 10 uniformly illuminates the reticle pattern. The reticle stage 25 and the wafer stage 56 is relatively scanned at the speed ratio of the projection magnification, and the controller 60 obtains the position of the wafer stage 45 via an interferometer 44 and exposes the shot area on the reticle. The wafer stage 45 stepwise moves next shot after exposure of one shot is completed, is scanned in an opposite direction to the last scanned direction, and next shot is exposed. The all shot on wafer 40 is exposed by repeating this operation.

During the scan exposure in one shot, the controller 60 obtains the position information of the wafer surface 41 via the focus tilt measuring system 50, calculates a shift amount from the optimal image plane and drives the wafer stage 45 in Z direction and tilt direction via the driving mechanism 48. Thereby, the form of the wafer surface 41 in the height direction can accord with the optimal image plane per exposure slit. Particularly, the controller 60 can offset the error measurement amount based on the level difference P on the wafer surface 41 and can achieve the focus control with high accuracy.

Figure 19:
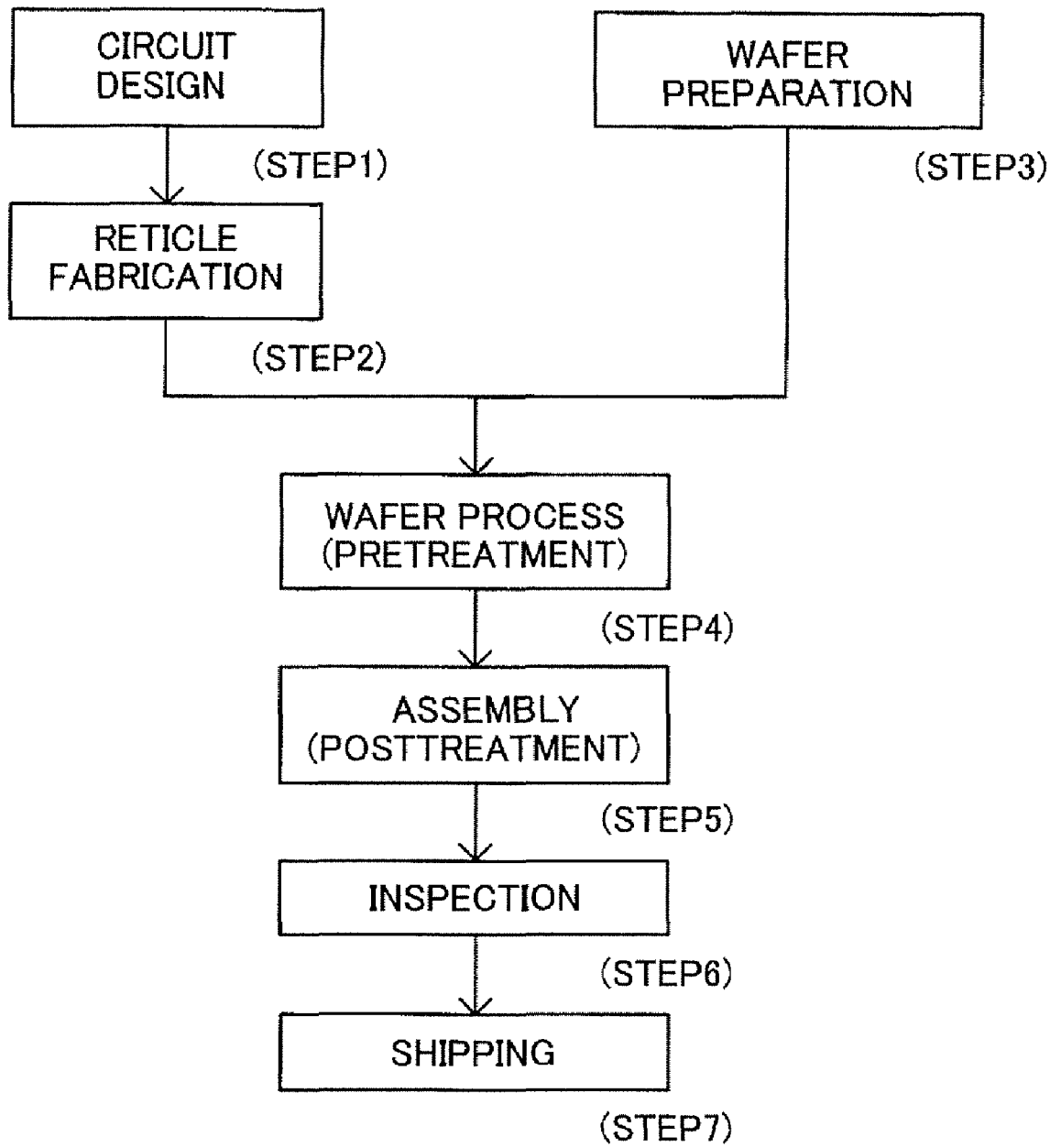
FIG. 19 is a flowchart for explaining a method for fabricating devices (semiconductor chips such as ICs, LSIs, and the like, LCDs, CCDs, etc.).
Figure 20:
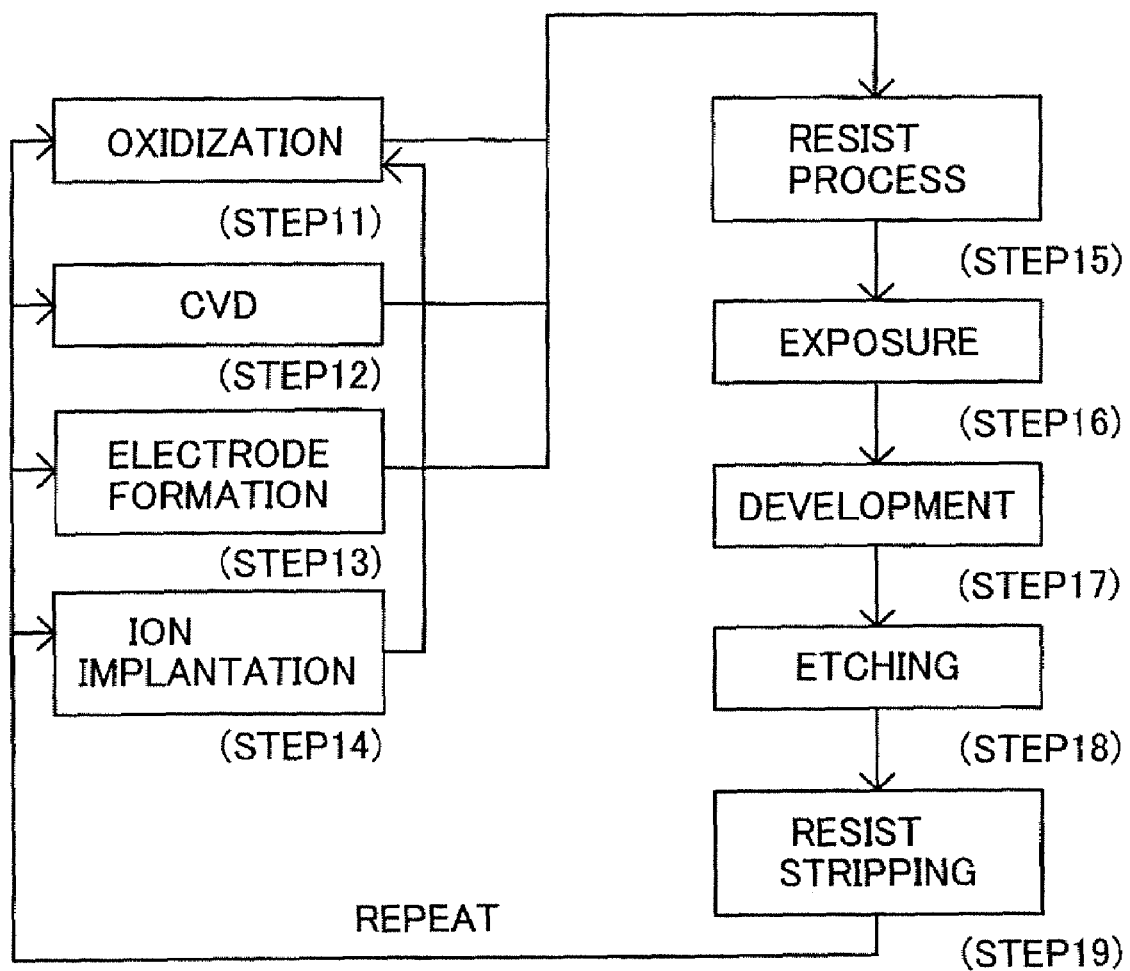
FIG. 20 is a detail flowchart of a wafer process in Step 4 of FIG. 19.

Referring now to FIGS. 19 and 20, a description will be given of an embodiment of a device fabrication method using the above mentioned exposure apparatus 1. FIG. 19 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 20 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one because the focus tilt measuring system 50 measures the position of the wafer surface 41 with high accuracy and the controller 60 achieves the focus control with high accuracy. Thus, the device fabrication method using the exposure apparatus 1, and resultant devices constitute one aspect of the present invention.

FIRST EMBODIMENT

Figure 6:
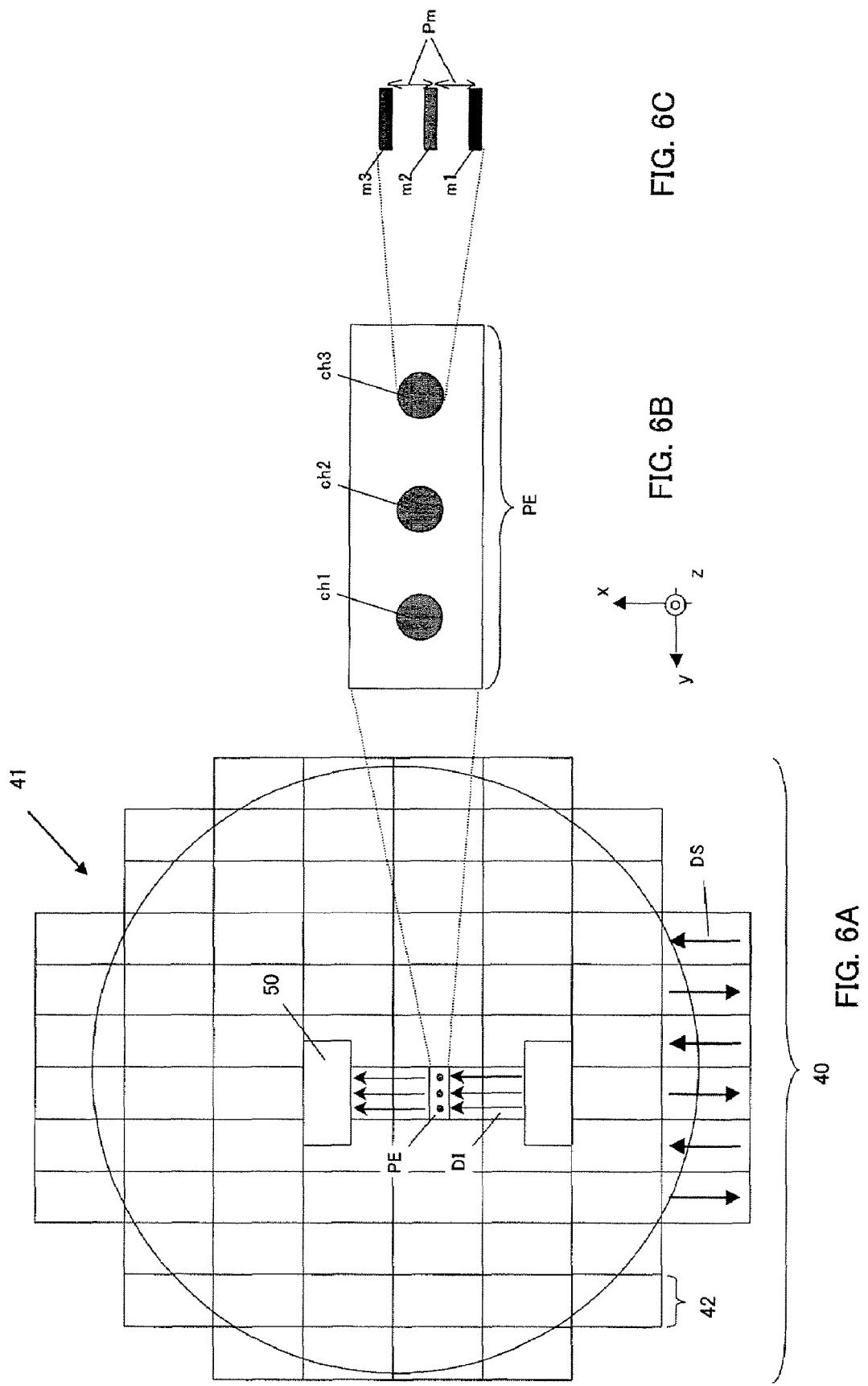
FIG. 6A is a schematic plane view of a wafer surface in a first embodiment and the focus tilt measuring system shown in FIG. 1.
FIG. 6B is a schematic enlarged plane view of three measurement points shown in FIG. 6A.
FIG. 6C is a schematic enlarged plane view of each measurement point shown in FIG. 6B.
Figure 7:
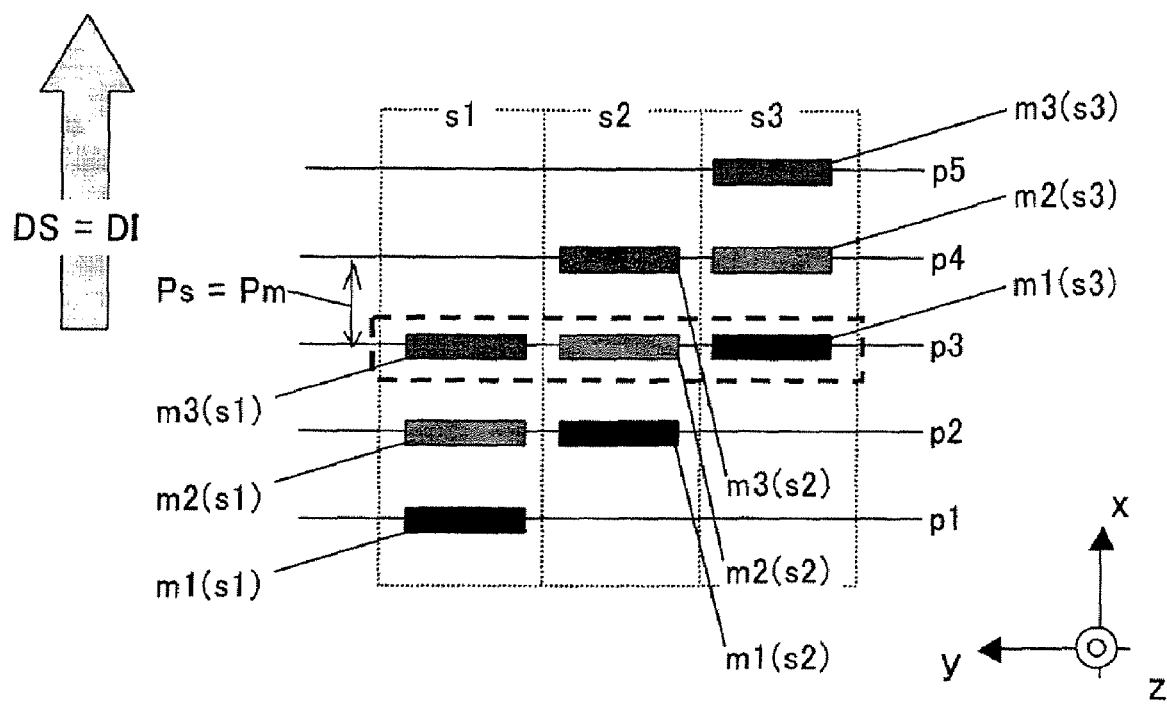
FIG. 7 is a schematic plane view of a relationship between a mark image and a measurement point when a scanning pitch and a mark pitch are an equal interval and five measurement points are measured using three mark images by three times scanning in a first embodiment.

Referring to FIGS. 6A to 7, a description will be given of the focus control of the first embodiment. Here, FIG. 6A is a schematic plane view of the wafer surface 41 and the focus tilt measuring system 50. The wafer surface 41 has plural shots 42, and the scanning direction DS in each shot is +X direction or −X direction. FIG. 6B is a schematic enlarged plane view of three measurement points shown in FIG. 6A. FIG. 6C is a schematic enlarged plane view of each measurement point shown in FIG. 6B.

In scan exposure to the entire wafer shown in FIG. 6A, three measurement points (ch1, ch2, ch3) are arranged in the exposure slit PE as shown in FIG. 6B. ch1 to ch3 align in the slit longitudinal direction. The measurement light including three marks mh shown in FIG. 6C is projected onto each measurement point. The scanning direction DS and the incident direction DI of the focus tilt measuring system 50 are parallel.

The first embodiment sets an interval of the mark image projected on the wafer surface 41 (hereinafter, referred to as a "mark pitch") and an measurement interval (hereinafter, referred to as a "scanning pitch") at equal interval. The first embodiment measures five measurement points pj (j=1, 2, 3, 4, 5) using the mark image mh (h=1, 2, 3) by three times scanning si (i=1 to 3). Here, the mark pitch is defined by an interval between points that a principal ray shown in FIG. 2B and the wafer surface 41 cross when the wafer surface 41 is flat, or a distance between the centers of each mark image shown in FIG. 2C. Therefore, the mark pitch does not receive an influence of flatness on the wafer surface 41.

The conventional measuring system uses an average of three mark images mh at each scanning as a measurement value, and a focus measurement value F(pj) in a measurement point pj is shown by the following expression, where Zmh(si, pj) is a focus value of each mark mh at each scanning si.

$$F(pj)=\{Zmh-1(si,pj-1)+Zmh(si,pj)+Zmh+1(si,pj+1)\}/3 \quad (1)$$

For example, a focus measurement value F(p3) in p3 is shown by the following expression.

$$F(p3)=\{Zm1(s2,p2)+Zm2(s2,p3)+Zm3(s2,p4)\}/3 \quad (2)$$

If the scanning pitch Ps and the mark pitch Pm set at equal interval, the measurement point of the mark image mh accords with the measurement point pj as shown in FIG. 7. Here, FIG. 7 is a schematic plane view of a relationship between the mark image and the measurement point when the scanning pitch Ps and the mark pitch Pm are equal interval and five measurement point pj are measured using three mark images mh three time. At this time, since the average value of the measurement value on the same measurement point is used as a detected value, the detected value F(pj) is shown by the following expression.

$$F(p,j)=\{Zmh-1(si+1,pj)+Zmh(si,pj)+Zmh+1(si-1,pj)\}/3 \quad (3)$$

For example, the focus measurement value in p3 is shown by the following expression.

$$F(p3)=\{Zm1(s3,p3)+Zm2(s2,p3)+Zm3(s1,p3)\}/3 \quad (4)$$

Although the conventional expression (2) uses the average of the measurement results in the positions of p2 and p4 that are not related to the position of p3 to obtain the position of p3, the expression (4) in the instant embodiment only uses the average of the measurement result in the position of p3 to obtain the position of p3. Therefore, the instant embodiment measures the same measurement point plural times, and can improve the measurement accuracy in one measurement point. Thus, the instant embodiment pre-detects a non-exposed area in the exposure area on the wafer surface two times before scan exposure. In other words, the instant embodiment is different from the conventional pre-detection in that the instant embodiment pre-detects the measurement point ch of j=6 and 7 in FIG. 21 and calculates them.

Moreover, if the defocus amount of the projected marks m1 and m3 is symmetry as shown in FIG. 2B, the instant embodiment offsets the error measurement amount by averaging the measurement results in each mark as explained referring to FIG. 5 and can obtain the correctly information of the measurement point. For example, in FIG. 7, when the each mark exists on the level difference P, the error measurement amount (Emh) in the measurement point p3 is Em1 (p3)=−100 nm, Em2 (p3)=0 nm and Em3 (p3)=100 nm. At this time, the edge mark is a couple of mark that is the same amount and opposite sign, and is Em1 (p3)=−Em3 (p3). On the other hand, the error measurement amount in other measurement points by the level difference is zero. At this time, the detected value ΔF to the error measurement amount Emj (si, pj) (h=1 to 3, i=1 to 3, j=1 to 5) is shown by the following expression in the conventional algorithm, and although the error measurement amount is decreased by the average effect, the measurement point that remains the error measurement amount exists.

$$\Delta F(p2)=\{Em1(s1,p1)+Em2(s1,p2)+Em3(s1,p3)\}/3= (0+0+100)/3=33 \text{ nm} \quad (5)$$

On the other hand, the instant embodiment is shown by the following expression, the error measurement amount is offset and is 0 in every measurement point. If the error measurement amount is decreased from 33% to 10% of the conventional, the remarkably effect materializes in the measurement accuracy.

$$\Delta F(p3)=\{Em1(s3,p3)+Em2(s2,p3)+Em3(s1,p3)\}/3=(-100+0+100)/3=0 \text{ nm} \quad (6)$$

Thus, the error measurement amount is offset by measuring the same measurement point plural times and averaging, and the measurement accuracy in one measurement point can be further improved. The expression (6) uses all of three marks and may uses a couple of mark that is the same amount and opposite sign.

Moreover, a measurement effective area may be limited in a shot near the edge of the wafer. For example, if p1 cannot be measured in FIG. 7, the measurement value in p2 becomes two mark measurement values in the conventional method and the measurement accuracy decreases. Particularly, the decrease effect of the error measurement becomes 33% to 50%. However, the present invention measures p2 plural times without receiving the influence of p1 and can improve the measurement accuracy in one measurement point. Moreover, the present invention offsets the error measurement amount if the level difference P exists on p2, and can further improve the measurement accuracy in one measurement point.

The actually defocus amount of the oblique incidence measuring system 51 can obtain a focusing position from a half bandwidth and contrast of the mark image observed by the image pick-up device 58 provided near the focal point. The focusing position can be obtained from the error measurement amount at scanning the level difference pattern using a character that the error measurement amount by the level difference P is proportional to the defocus amount of the measuring system 51 in the optical axis direction.

SECOND EMBODIMENT

Figure 8:
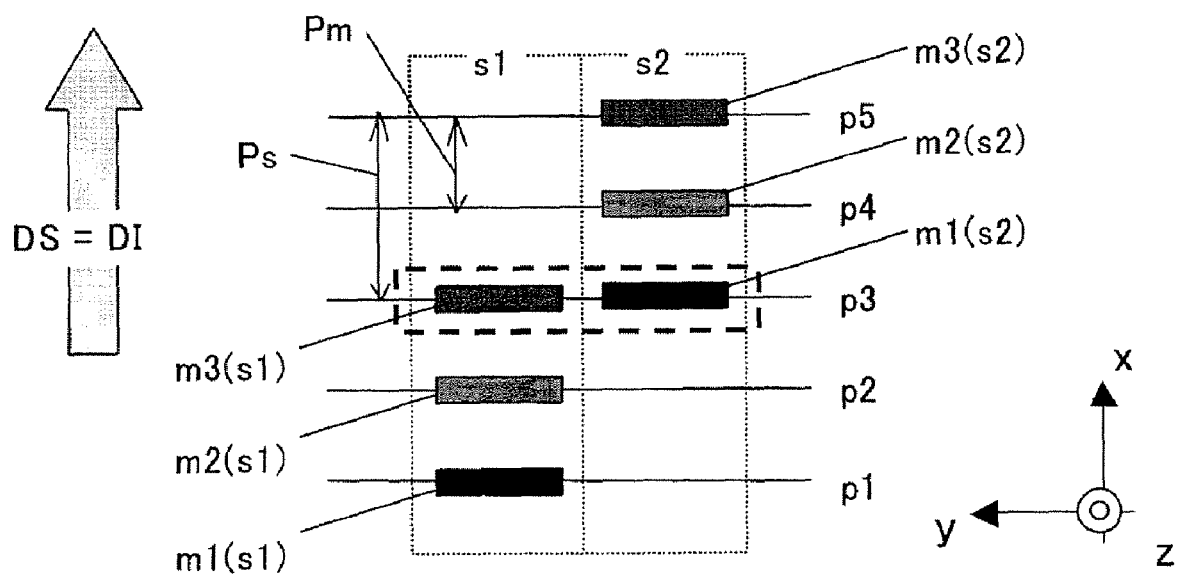
FIG. 8 is a schematic plane view of a relationship between a mark image and a measurement point when a scanning pitch is twice a mark pitch and five measurement points are measured using three mark images by two times scanning in a second embodiment.
Figure 9:
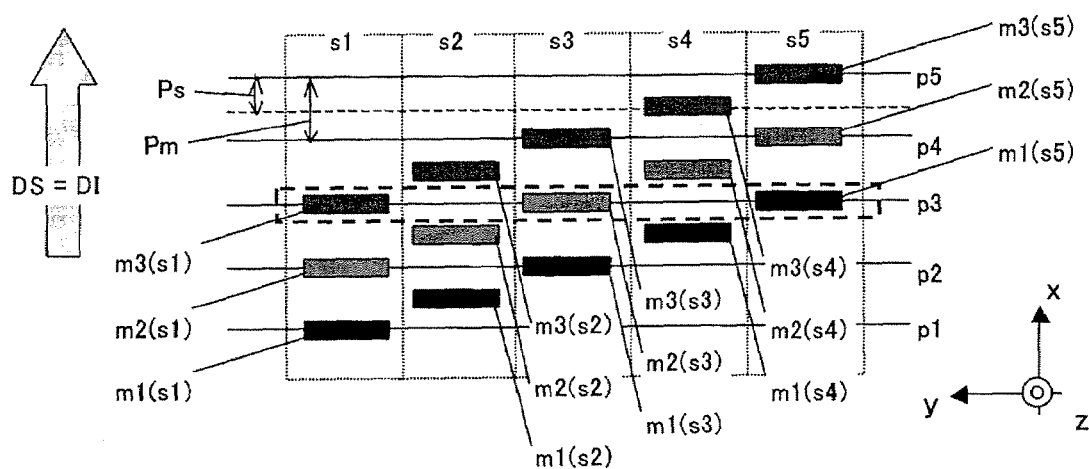
FIG. 9 is a schematic plane view of a relationship between a mark image and a measurement point when a scanning pitch is the half of a mark pitch and five measurement points are measured using three mark images by two times scanning in a second embodiment.

Referring to FIGS. 8 and 9, a description will be given of the focus control of the second embodiment. Here, FIG. 8 is a schematic plane view of a relationship between the mark image and the measurement point when the scanning pitch Ps is twice the mark pitch Pm and five measurement point pj is measured using the mark image mh by two times scanning. The first embodiment sets the scanning pitch Ps and the mark pitch Pm at equal interval. However, if the mark image can be overlapped even if the scanning pitch Ps and mark pitch Pm are not equal interval, the effect of measurement accuracy improvement by the offset can be obtained.

This effect can be obtained by overlapping the mark m3 at scanning measurement s1 and the mark m1 at scanning measurement s2, and the detected value F(p, j) is shown by the following expression.

$$F(p3)=\{Zm3(s1,p3)+Zm1(s2,p3)\}/2 \quad (7)$$

At this time, since the same measurement point is measured plural times and is averaged, the measurement accuracy in one measurement point can be improved. Moreover, if the defocus amount of the projected mark images m1 and m3 is symmetry as shown in FIG. 2B, the error measurement amount is offset by averaging the measurement results in each mark as described referring to FIG. 3, and the correctly information of the measurement point can be obtained.

The scanning pitch Ps is not limited to twice the mark pitch Pm. FIG. 9 is a schematic plane view of a relationship between the mark image and the measurement point when the scanning pitch Ps is the half of the mark pitch Pm and five measurement points pj is measured using the mark image mh by two times scanning. In this case, the principle of the instant embodiment can be used by overlapping m3 at scanning measurement s1, m2 at scanning measurement s3 and m1 at scanning measurement s5, and the detected value F(p3) is shown by the following expression.

$$F(p3)=\{Zm3(s1,p3)+Zm2(s3,p3)+Zm1(s5,p3)\}/3 \quad (8)$$

Thus, the same measurement point is measured plural times and the measurement accuracy in one measurement point can be further improved. Moreover, if the defocus amount of the projected mark images m1 and m3 is symmetry as shown in FIG. 2B, the error measurement amount is offset by averaging the measurement results in each mark as described referring to FIG. 5, and the correctly information of the measurement point can be obtained.

In the instant embodiment, the following relationship is met between the scanning pitch Ps and the mark pitch Pm, the measurement accuracy in one measurement point can be improved by measuring the same measurement point plural times and averaging, and the error amount can be offset.

$$Ps=n \times Pm \text{ or } Ps=1/n \times Pm \text{ (n: natural number, } n<h) \quad (9)$$

THIRD EMBODIMENT

Figure 10A:
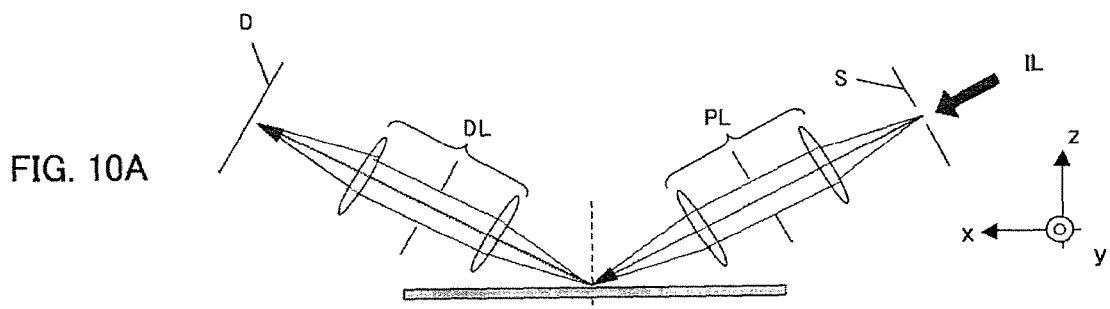
FIG. 10A is a schematic sectional view of a oblique incidence measuring system of a focus tilt measuring system shown in FIG. 1 used for a third embodiment.
Figure 10B:
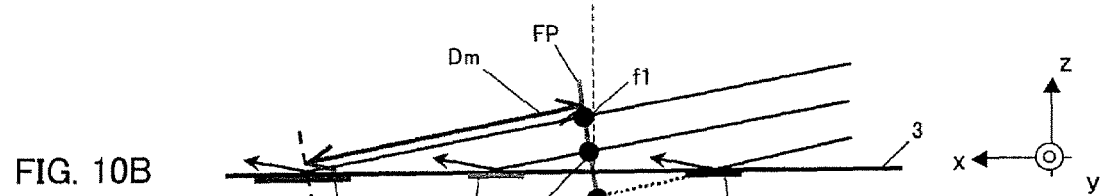
FIG. 10B is an enlarged sectional view of a grazing incidence light shown in FIG. 10A near a wafer surface when a mark image m2 does not accord with a wafer surface.
Figure 10C:
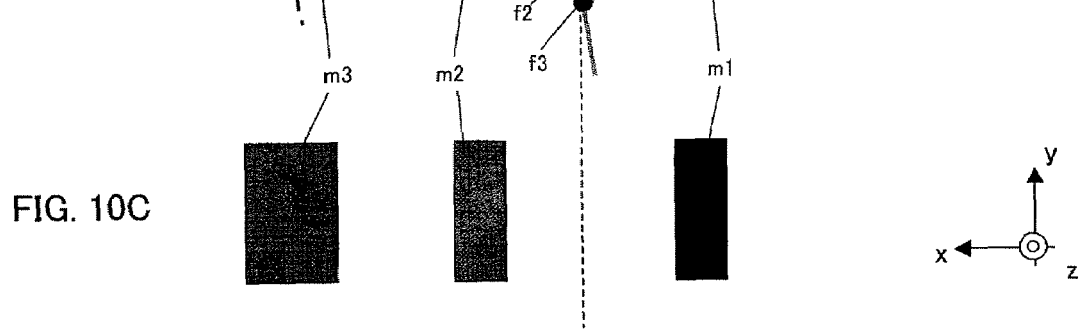
FIG. 10C is a schematic plane view of a mark image shown in FIG. 10B that is projected onto the wafer surface.

Referring to FIGS. 10A and 10C, a description will be given of the focus control of the third embodiment. In the third embodiment, the mark image m2 does not accord with the wafer surface 41 as shown in FIG. 2B, and the mark images m1 and m3 is not a couple of mark that is the same amount and opposite sign. Here, FIG. 10A is a schematic sectional view of the oblique incidence measuring system 51 shown in FIG. 1 in the third embodiment. FIG. 10B is an enlarged sectional view of a grazing incidence light shown in FIG. 10A near the wafer surface. FIG. 10C is a schematic plane view of the mark image shown in FIG. 10B that is projected onto the wafer surface.

FIG. 10B is similar to FIG. 2B. However, FIG. 10B is different from FIG. 2B in that the imaging point f2 of the mark image m2 does not accord with the wafer surface 41 and the defocus amount is asymmetry in three mark images mh. As a result, the error measurement amount (Emj) by the level difference P occurred at measurement of each mark is, for example, Em1 (p3)=−100 nm, Em2 (p3)=100 nm and Em3 (p3)=200 nm. The mark images m1 and m3 is not a couple of mark that is the same amount and opposite sign, and is Em1 (p3)≠−Em3 (p3). On the other hand, the error measurement amount in other measurement points by the level difference is zero.

In the expression 2, the measurement point that remains the error measurement exists as above-mentioned. On the other hand, if a sum of the defocus amount of the mark used for the average is almost zero, the error measurement amount can be offset using the character that the error measurement amount by the level difference P is proportional to the defocus amount of the measuring system 51 in the optical axis direction. In other words, the error amount can be cancelled by overlapping only the marks of m1 and m2 as shown in the following expression. Here, "almost zero" means that the sum of the defocus amount of two marks images on the surface of the target to be measured is less than 10%. This is an especially effect more than 33% obtained from the expression (5). However, the present invention may has the effect that measures the same measurement point plural times and averages it, and does not always require the effect of offset.

$$\Delta F(p3)=\{Zm2(s2,p3)+Zm1(s3,p3)\}/2=(-100+100)/3=0 \text{ nm} \quad (10)$$

If the sum of the defocus amount of plural overlapped marks is almost zero, the third embodiment offsets the error measurement amount by averaging the measurement results in each mark and can improve the measurement accuracy in one measurement point.

FOURTH EMBODIMENT

Figure 11:
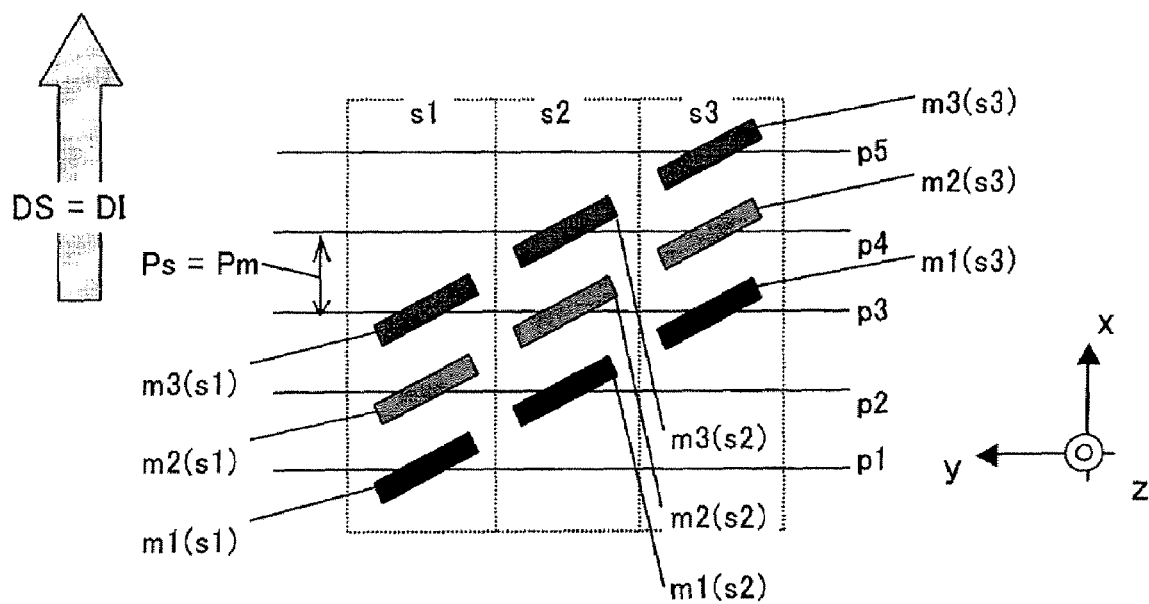
FIG. 11 is a schematic plane view of a relationship between a mark image and a measurement point when five measurement points are measured using three mark images that inclines to an incident direction by three times scanning in a fourth embodiment.

Referring to FIG. 11, a description will be given of the focus control of the fourth embodiment. Here, FIG. 11 is a schematic plane view of a relationship between the mark image and the measurement point when five measurement points pj are measured using three mark images mh that inclines to the incident direction DI by three times scanning. Thus, the fourth embodiment gives an angle to the incident direction DI to the mark image DI. The inclination angle is formed in a direction that an inclination of the straight line shown in FIG. 5 becomes small. An inclination direction to the incident direction DI of the mark image mh determines the inclination of the straight line shown in FIG. 5. Although the instant embodiment has the effect that offsets the measurement offset, the measurement offset is preferably small if the measurement error is considered. The effect that decreases the original error measurement by the level difference P can be achieved by giving the angle to the actually circuit pattern to the projected mark image. Thereby, the surface position of the measurement point ch can be obtained with high accuracy.

FIFTH EMBODIMENT

Figure 12:
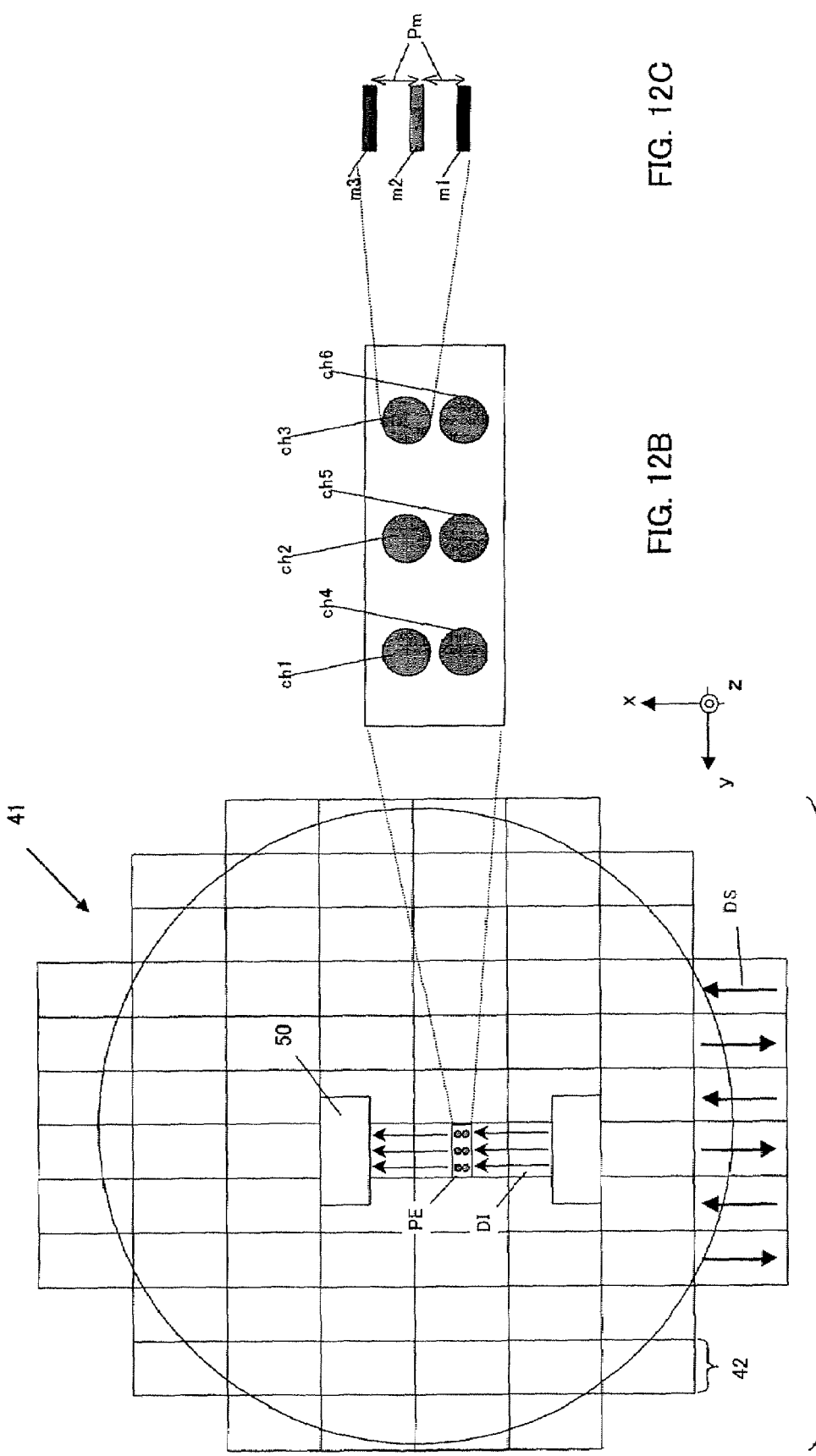
FIG. 12A is a schematic sectional view of a wafer surface and a focus tilt measuring system shown in FIG. 1 in a fifth embodiment.
FIG. 12B is a schematic enlarged plane view six measurement points shown in FIG. 12A.
FIG. 12C is a schematic enlarged plane view of each measurement point shown in FIG. 12B.
Figure 13:
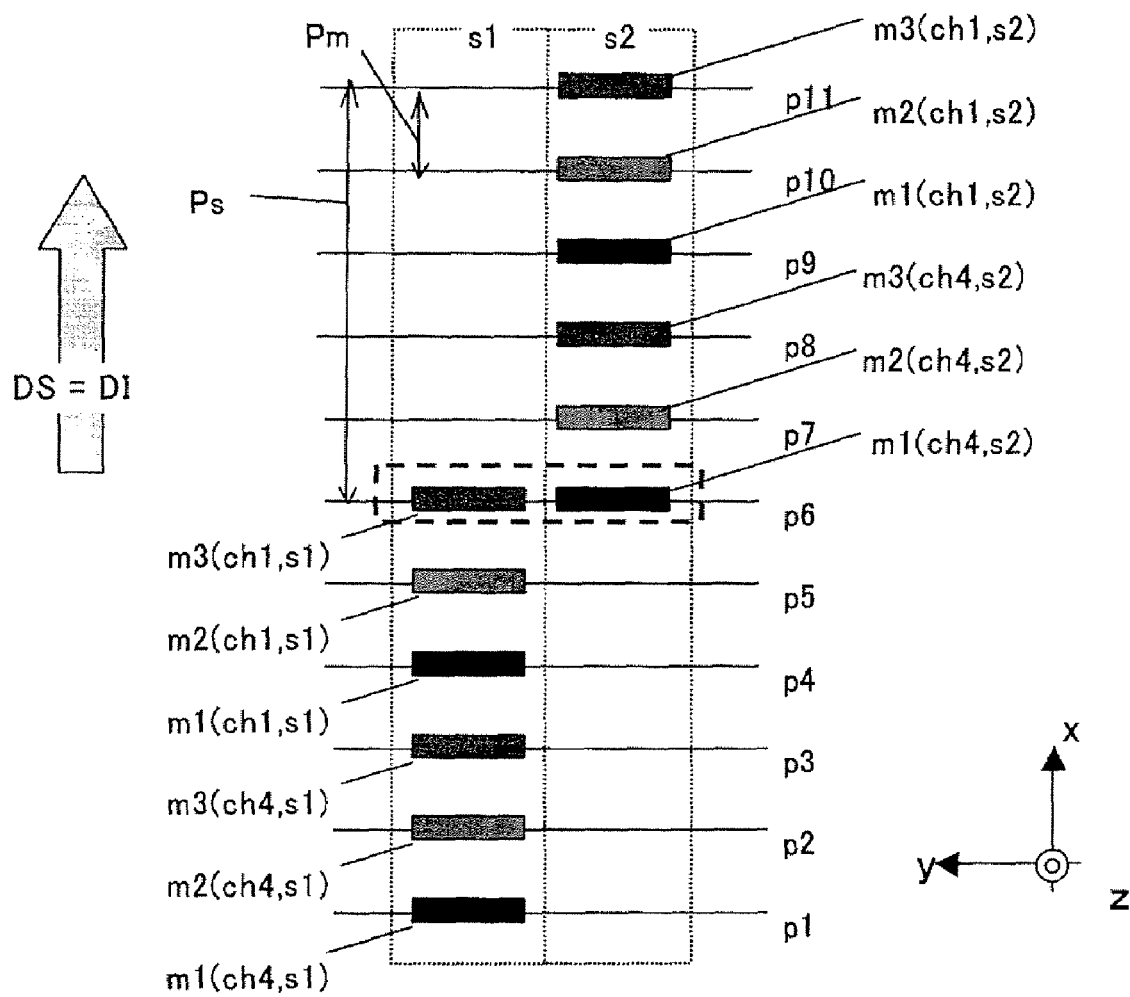
FIG. 13 is a schematic plane view of a relationship between a mark image and a measurement point when a scanning pitch is more than a mark pitch×the number of marks and eleven measurement points are measured using six mark images by two times scanning in a fifth embodiment.

Referring to FIGS. 12A to 13, a description will be given of the focus control of the fifth embodiment. Here, FIG. 12A is a schematic plane view of the wafer surface 41 and the focus tilt measuring system 51 in the fifth embodiment. The wafer surface 41 has plural shots 42, and the scanning direction DS in each shot is +X direction or −X direction. FIG. 12B is a schematic enlarged plane view of six measurement points shown in FIG. 12A. FIG. 12C is a schematic enlarged plane view of each measurement point shown in FIG. 12B. FIG. 13 is a schematic plane view of a relationship between the mark image and the measurement point when the scanning pitch Ps is more than the mark pitch Ps×the number of marks and eleven measurement points pj are measured two times using six mark images mh.

In scan exposure to the entire wafer shown in FIG. 12A, six measurement point (ch1, ch2, ch3, ch4, ch5, ch6) are arranged in the exposure slit PE as shown in FIG. 12B. ch1 to ch3 align in the slit longitudinal direction, and ch4 to ch6 align in the slit longitudinal direction. ch1 and ch4 align in the scanning direction. ch2 and ch5 align in the scanning direction. ch3 and ch6 align in the scanning direction. The measurement light including three mark images mh shown in FIG. 6C is projected onto each measurement point. The scanning direction DS and the incident direction DI of the focus tilt measuring system 50 are parallel.

The fifth embodiment can obtain the effect of the measurement accuracy improvement even if the relationship between the mark pitch Pm and the scanning pitch Ps is a condition that does not satisfy the second embodiment, in other words, the condition that is n≧h (h: scanning pitch, h: the number of marks). In this case, it is considered that h is the number of marks including the measurement points of plural sequences that align in the scanning direction. Therefore, if the number of measurement points that align in the scanning direction is plurality, the number of marks may be one. If the scanning pitch Ps is more than the mark pitch Ps×the number of marks, the fifth embodiment can overlap the mark using the following expression.

$$F(p6)=\{Zm3(s1,ch1,p6)+Zm1(s2,ch4,p6)\}/2 \quad (11)$$

Thus, the fifth embodiment overlaps other two or more measurement points that the sum of the defocus amount of the mark image on the wafer surface 41 is almost zero, and can improve the measurement accuracy in one measurement point by measuring the same measurement point plural times and averaging it. Moreover, the fifth embodiment can decrease the error measurement amount by using one or more a couple of the mark that the defocus amount of the mark image on the wafer surface is the same amount and opposite sign.

SIXTH EMBODIMENT

Figure 14:
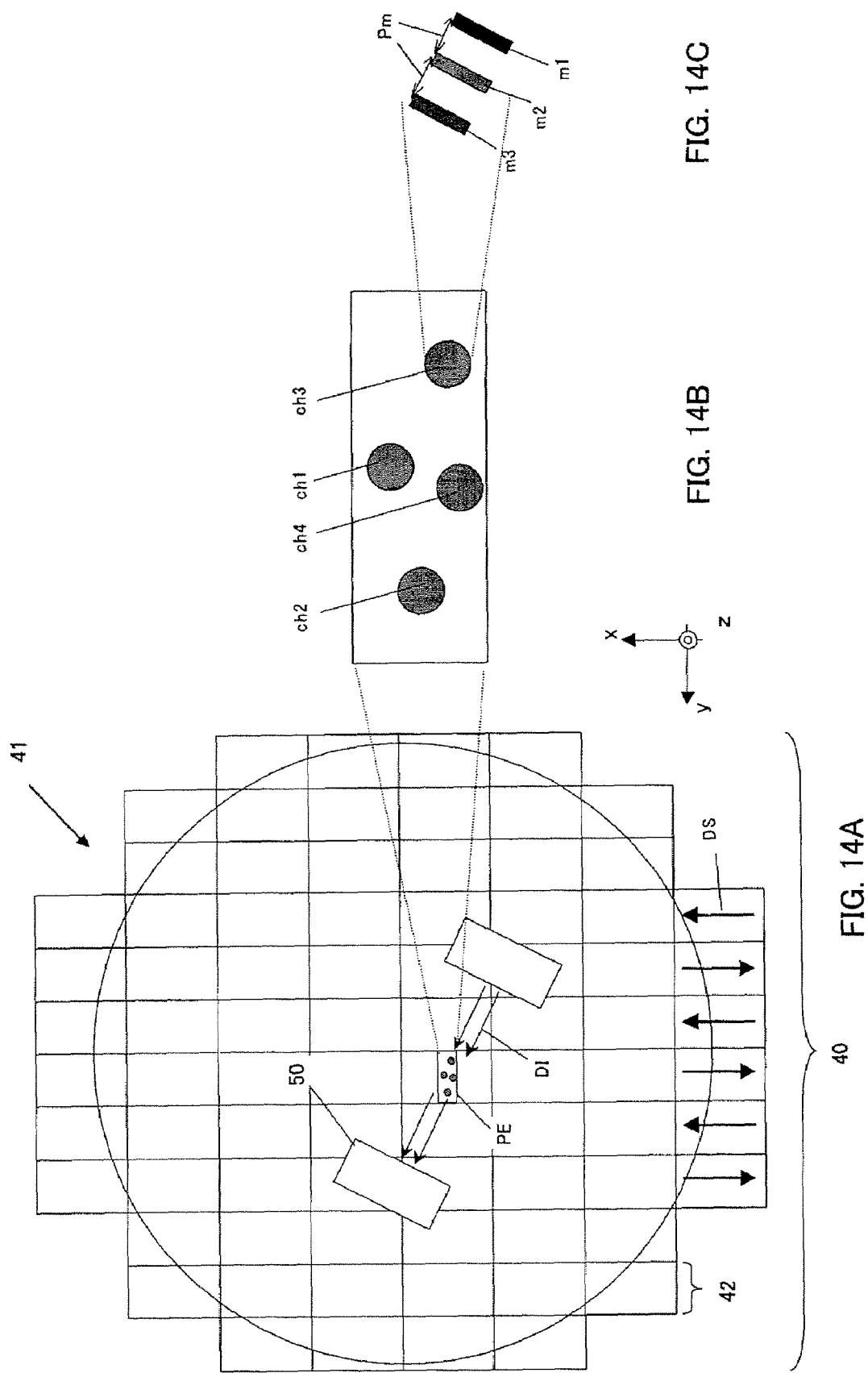
FIG. 14A is a schematic plane view of a wafer surface and a focus tilt measuring system shown in FIG. 1 in a sixth embodiment.
FIG. 14B is a schematic enlarged plane view of four measurement points shown in FIG. 14A.
FIG. 14C is a schematic enlarged view of each measurement point shown in FIG. 14B.
Figure 15:
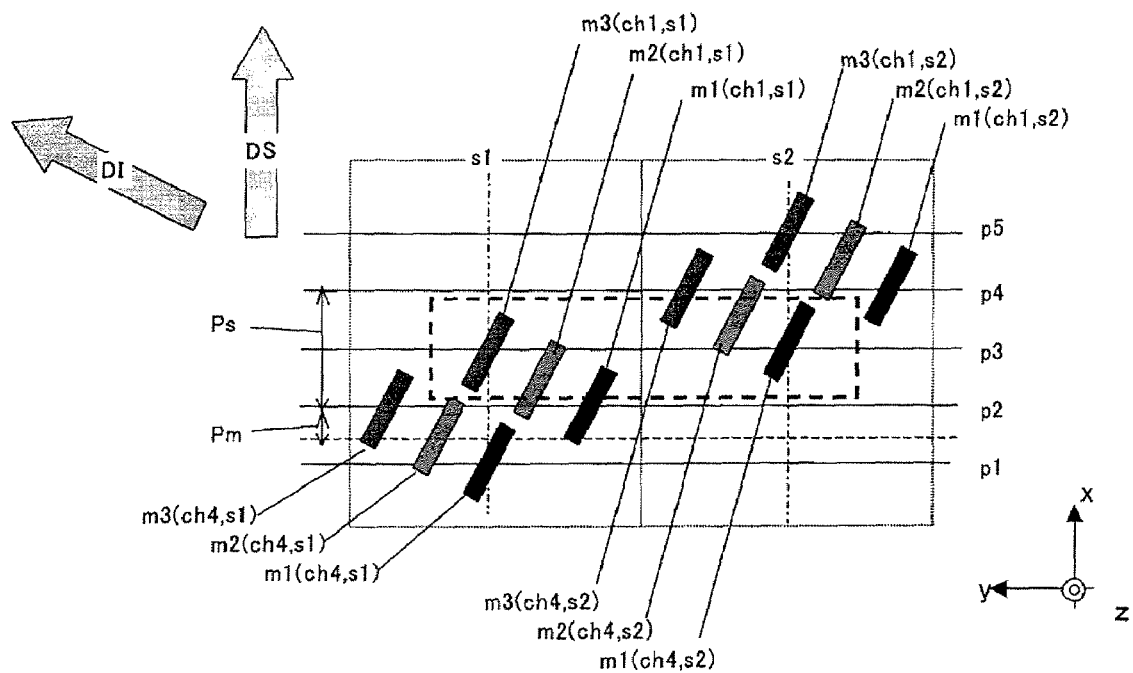
FIG. 15 is a schematic plane view of a relationship between a mark image and a measurement point when a scanning pitch is more than a mark pitch×the number of marks and five measurement points are measured using three mark images by two times scanning in a sixth embodiment.

Referring to FIGS. 14A to 15, a description will be given of the focus control of the sixth embodiment. Here, FIG. 14A is a schematic plane view of the wafer surface 41 and the focus tilt measuring system 50 in the sixth embodiment. The wafer surface 41 has plural shots 42 and the scanning direction DS in each shot is +X direction or −X direction. FIG. 14B is a schematic enlarged plane view of four measurement points shown in FIG. 14A. FIG. 14C is a schematic enlarged plane view of each measurement point shown in FIG. 14B. FIG. 15 is a schematic plane view of a relationship between the mark image and the measurement point when the scanning pitch Ps is more than the mark pitch Pm×the number of marks and five measurement points pj are measured two times using three mark images mh.

In the sixth embodiment, the scanning direction DS and the incident direction DI are non-parallel. At this time, the effect that improves the measurement accuracy by measuring the same measurement point plural time and averaging it can be obtained according the arrangement of the measuring system as shown in FIG. 15. Moreover, the effect that improves the measurement accuracy by offsetting the offset (error measurement amount) can be obtained. In FIG. 15, the detection point is arranged to the mark of the measurement point ch1 so that the mark of the measurement point ch4 is the same position in the scanning direction and the scanning pitch is optimized in consideration of the incident direction and mark pitch. Thereby, the above effect can be obtained as shown in the following expression.

$$F(p3)=\{Zm3(s1,ch1,p3)+Zm1(s2,ch4,p3)\}/2 \quad (12)$$

In FIG. 14B, a distance $D_1$ between the measurement points ch1 and ch4 in X direction and a distance $D_2$ between the measurement points ch1 and ch4 in Y direction satisfies the following expression. θ is an angle formed by the incident direction DI and scanning direction shown in FIG. 15 and Pm is the mark pitch Pm'×cos θ.

$$D1=Ps/n \text{ (}n\text{: natural number)}$$

$$D2=nPm'=n(\cos θ)Pm \quad (13)$$

Figure 16:
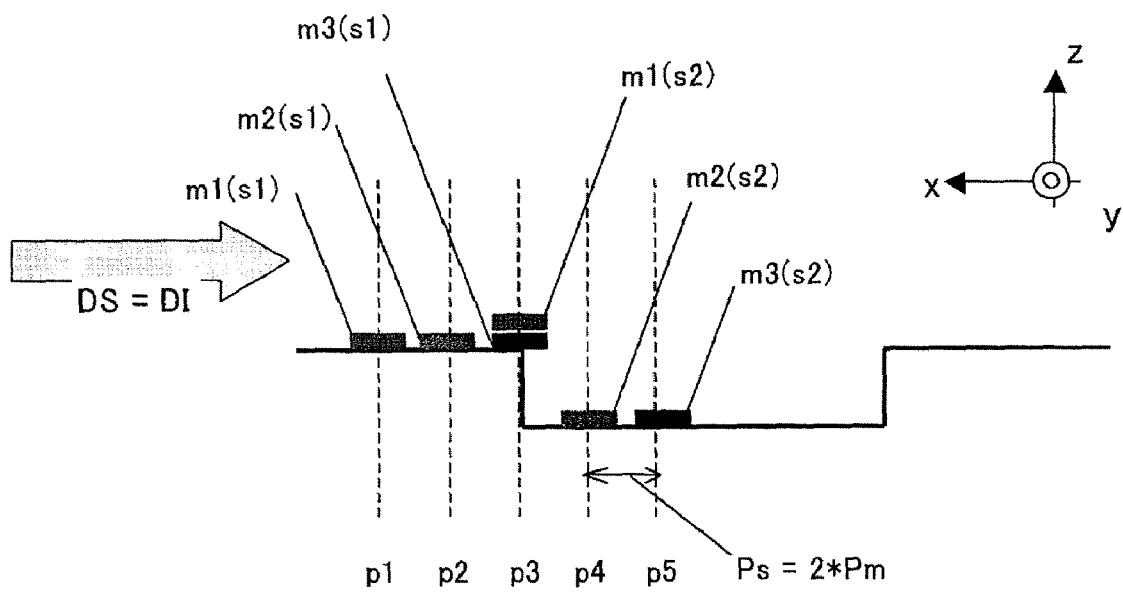
FIG. 16 is a schematic sectional view of a change of a projection position of three mark images on a wafer surface when a twin type measuring system in a sixth embodiment.
Figure 17:
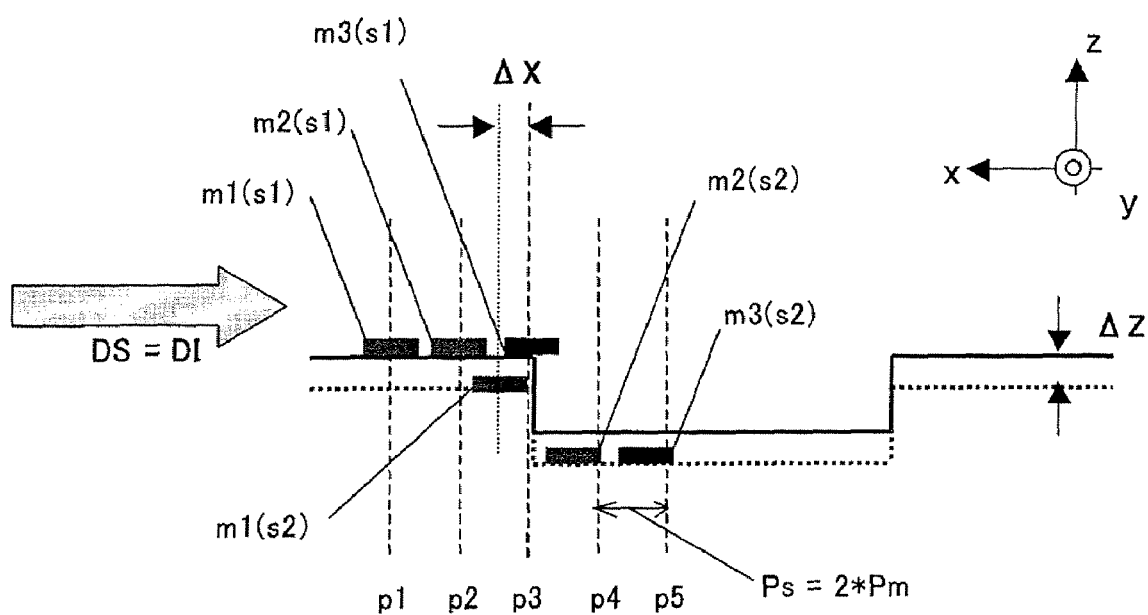
FIG. 17 is a schematic sectional view of a change of a projection position of three mark images on a wafer surface when a single type measuring system in a sixth embodiment.

The principle of the present invention that measures the same measurement point plural times and averages it can be widely apply the drive of the wafer surface 41. FIGS. 16 and 17 show a change of a projection position of three mark images on the wafer surface 41. Here, FIG. 16 shows a suitably to a twin type measuring system and FIG. 17 shows a suitably to a single type measuring system.

The exposure apparatus that includes the twin type measuring system includes a measurement station and an exposure station. The exposure station corresponds to the exposure apparatus 1 shown in FIG. 1, but does not include the focus tilt measuring system 50. The measurement station is a dedicated apparatus that measures a surface form of the wafer 40. The measurement result by the measurement station is directly provided to the controller 60, and the controller 50 calculates the position and inclination of the wafer surface 41 from the measurement result. The wafer stage is controlled based on the calculation result.

Since exposure is not executed in the measurement station, the focus control of the wafer in not executed during measurement. Therefore, the wafer surface 41 is not driven in X direction at measurement as shown in FIG. 16.

On the other hand, the single type has the exposure slit in j=5 as described referring to FIG. 21, and measures the measurement points ch in j=6 and 7 during scan exposure. Therefore, the focus operation for scan exposure is executed during measurement. In other words, the wafer surface 41 is driven by ΔZ in Z direction on real time during measurement as shown in FIG. 17. Therefore, strictly, the position of the mark image projected on the wafer surface 41 and the position of the mark image overlapped after predetermined scanning shift by ΔX, and the defocus amount in the optical axis direction of the projection optical system changes. However, the driving amount in Z direction at detection of the focus in actually exposure apparatus is several µm, and ΔX and the defocus amount in the optical axis direction of the projection optical system 30 is several ten µm in consideration of the incident angle. Therefore, ΔX and the defocus amount in the optical axis direction of the projection optical system 30 is very small to several mm in the scan area of the mark image, and the mark image can be overlapped with high accuracy.

SEVENTH EMBODIMENT

Figure 18A:
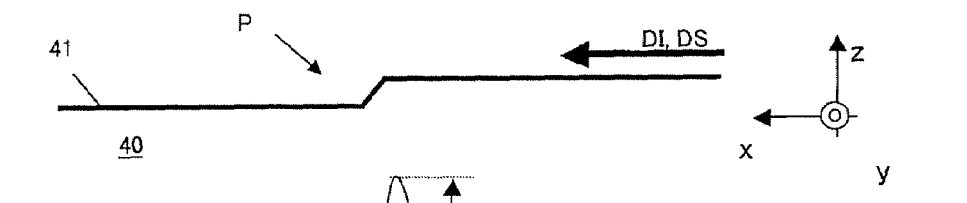
FIG. 18A is a schematic sectional view of the exposure apparatus shown in FIG. 1 when a level difference exists on the wafer surface.
Figure 18B:
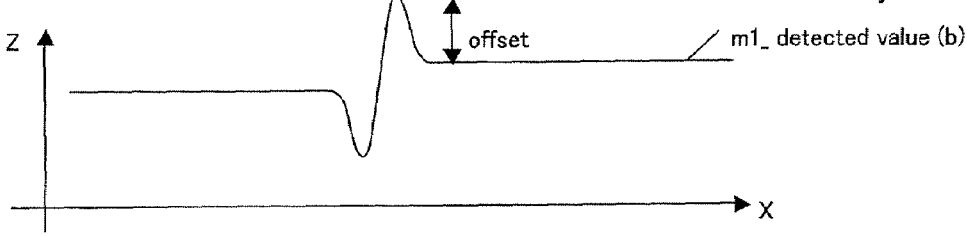
FIG. 18B is a measurement waveform that corresponds to a mark m1 on the level difference shown in FIG. 18A.
Figure 18C:
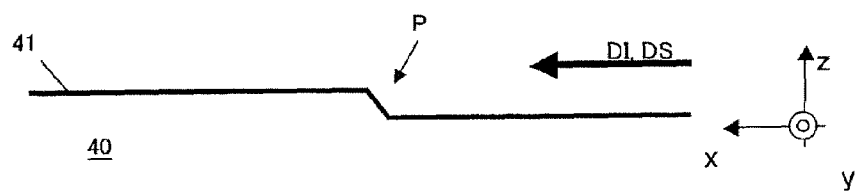
FIG. 18C is a schematic sectional view of the wafer surface shown in FIG. 18A rotated by 180 degrees.
Figure 18D:
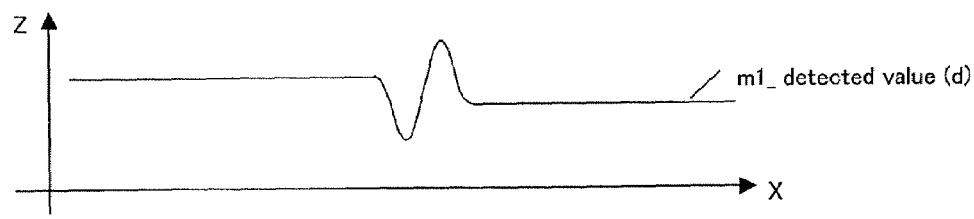
FIG. 18D is a measurement waveform that corresponds to a mark m1 on the level difference shown in FIG. 18C.
Figure 18E:
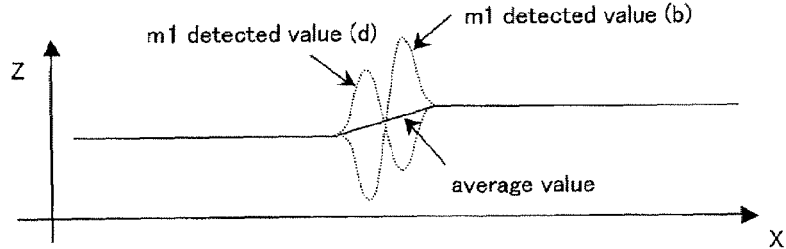
FIG. 18E is a waveform view overlapped the waveforms shown in FIGS. 18B and 18D.

Referring to FIGS. 18A to 18E, a description will be given of the focus control of the seventh embodiment. Here, FIGS. 18A and 18C are sectional views of the wafer surface 41 that has the level difference P from an opposite direction. FIGS. 18B and 18D are waveform views obtained from the mark image m1 on the level difference P shown in FIGS. 18A and 18C. FIG. 18E is a waveform view overlapped the waveforms shown in FIGS. 18B and 18D.

The seventh embodiment measures arbitrary one point on the wafer surface 41, before and after rotating 180 degrees on a plane perpendicular to the optical axis of the projection optical system 30, and uses the average value as the surface position measurement value in the measurement point. If the surface position is obtained by scanning measurement to the wafer surface 41 that has the level difference P shown in FIG. 18A, the detected result shown in FIG. 18B is obtained. Then, the wafer 40 is rotated by 180 degrees as shown in FIG. 18C, and if the surface position is obtained by the same scanning measurement, the detected result shown in FIG. 18D is obtained. FIG. 18B is different from FIG. 18D in that the error measurement amount in the same position is the same amount and opposite sign. Therefore, the average value of the detected result in the same measurement point before and after the wafer is rotated by 180 degrees is the result shown in FIG. 18E, and the error measurement amount can be offset.

The instant embodiment rotates the wafer stage 45 by 180 degrees, but may rotates the focus tilt measuring system 50 by 180 degrees or may reverses the scanning direction. The structure that arranges a couple of the measuring system opposite to each other as shown in Japanese Patent Application, Publication No. 11-16827 needs to the projection optical system 54 arranged at 180 degrees and the receiving optical system 56 in each oblique incidence measuring system 51, and cannot arrange a couple of the projection optical system 54 at 180 degrees by the interference of the measuring system. As a result, the measurement light cannot be projected on the same position, and the same accuracy as the instant embodiment cannot be obtained.

Furthermore, the present invention is not limited to these preferred embodiments and various variations and modifications may be made without departing from the scope of the present invention. For example, the present invention can apply the reticle measuring system that measures the poition of the reticle.

This application claims a foreign priority benefit based on Japanese Patent Application No. 2005-214462, filed on Jul. 25, 2005, which is hereby incorporated by reference herein in its entirety as if fully set forth herein.

What is claimed is:

1. An exposure apparatus for exposing a pattern of a reticle onto a plate while synchronously scanning the reticle and the plate, the exposure apparatus comprising:
    a projection optical system for projecting the pattern of the reticle onto the plate;
    a measuring part for measuring a position of a surface of a target to be measured in an optical axis direction of the projection optical system; and
    a controller for controlling the position of the surface of the target in the optical axis direction based on a measurement result by the measuring part,
    wherein the measuring part measures the position of the surface of the target by projecting plural mark images onto the surface of the target and detecting the plural mark images on the surface of the target, and projects at least three mark images among the plural mark images onto a same measurement point on the target,
    wherein the controller uses, as a measurement value of the same measurement point, an average value of plural measurement results obtained by detecting the at least three mark images at the same measurement point,
    wherein the at least three mark images are arranged at regular intervals, and only a central mark image among the at least three mark images is formed on the surface of the target, and
    wherein the target is the reticle or the plate.

2. An exposure apparatus according to claim 1, wherein an alignment direction of the plural mark images is non-perpendicular to a projected direction.

3. An exposure apparatus according to claim 1, wherein a projected direction of the plural mark images and a scanning direction of the target are parallel.

4. An exposure apparatus according to claim 1, wherein a projected direction of the plural mark images and a scanning direction of the target are non-parallel.

5. An exposure apparatus according to claim 1, further comprising a stage for supporting and driving the target,
    wherein said measuring part measures the target in states that the stage is 0 degree and rotates by 180 degrees.

6. An exposure apparatus for exposing a pattern of a reticle onto a plate while synchronously scanning the reticle and the plate, the exposure apparatus comprising:
    a projection optical system for projecting the pattern of the reticle onto the plate;
    a measuring part for measuring a position of a surface of a target to be measured in an optical axis direction of the projection optical system; and
    a controller for controlling the position of the surface of the target in the optical axis direction based on a measurement result by the measuring part,
    wherein the measuring part measures a position of the same measurement point on the surface of the target plural times,
    wherein the controller uses, as a measurement value of the same measurement point, an average value of plural measurement results obtained at the same measurement point,
    wherein the target is the reticle or the plate, and
wherein n>h and Ps=n×Pm or Ps=1/n×Pm are met, where Pm is a first interval of plural mark images, Ps is a second interval along a scanning direction of the measurement point that the plural mark images are projected, n is a natural number, and h is the number of mark images.

7. An exposure apparatus according to claim 6, wherein said measuring part projects measurement light of plural sequences in the scanning direction, and
    wherein said number of the mark image is a total of the mark image included in the measurement light of the plural sequences.

* * * * *